(12) United States Patent
Farrah et al.

(10) Patent No.: US 11,333,014 B2
(45) Date of Patent: May 17, 2022

(54) ELECTRICAL ISOLATION TO REDUCE MAGNETOMETER INTERFERENCE

(71) Applicant: Halliburton Energy Services, Inc., Houston, TX (US)

(72) Inventors: John Harrison Farrah, Houston, TX (US); Anand Prakash, Tomball, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 611 days.

(21) Appl. No.: 15/109,928

(22) PCT Filed: Jul. 27, 2015

(86) PCT No.: PCT/US2015/042285
§ 371 (c)(1),
(2) Date: Jul. 6, 2016

(87) PCT Pub. No.: WO2017/019021
PCT Pub. Date: Feb. 2, 2017

(65) Prior Publication Data
US 2017/0242145 A1      Aug. 24, 2017

(51) Int. Cl.
*E21B 47/0228*     (2012.01)
*G01V 3/18*          (2006.01)
(Continued)

(52) U.S. Cl.
CPC .......... *E21B 47/0228* (2020.05); *E21B 47/01* (2013.01); *E21B 47/024* (2013.01);
(Continued)

(58) Field of Classification Search
CPC .......... G01V 3/26; E21B 7/04; E21B 47/024; E21B 47/122; E21B 49/00; E21B 17/1078; E21B 43/2406
See application file for complete search history.

(56) References Cited

U.S. PATENT DOCUMENTS

| 4,605,268 | A | * | 8/1986 | Meador | H01F 38/14 439/194 |
| 6,404,350 | B1 | * | 6/2002 | Soulier | F16L 25/021 340/854.4 |
| 6,467,545 | B1 | * | 10/2002 | Venkataraman | E21B 17/01 166/355 |

(Continued)

FOREIGN PATENT DOCUMENTS

WO      2013191686 A1    12/2013

OTHER PUBLICATIONS

International Search Report and Written Opinion for PCT/US2015/042285 dated Mar. 30, 2016.

*Primary Examiner* — Robert E Fuller
*Assistant Examiner* — Neel Girish Patel
(74) *Attorney, Agent, or Firm* — Benjamin Ford; C. Tumey Law Group PLLC

(57) ABSTRACT

A magnetic flux receiver assembly includes a collar that defines a central passageway and an axial collar face, and a tool insert disposable within the central passageway and defining an axial insert face. One or more magnetometers are operatively coupled to the tool insert. One or more buttons are coupled to one or both of the axial collar face and the axial insert face such that an axial gap is defined at an axial interface between the axial collar face and the axial insert face to prevent electrical communication across the axial interface.

19 Claims, 7 Drawing Sheets

(51) Int. Cl.
*E21B 47/0232* (2012.01)
*E21B 47/01* (2012.01)
*G01R 33/00* (2006.01)
*G01V 3/26* (2006.01)
*E21B 47/024* (2006.01)
*E21B 43/24* (2006.01)

(52) U.S. Cl.
CPC ...... *E21B 47/0232* (2020.05); *G01R 33/0047* (2013.01); *G01V 3/18* (2013.01); *G01V 3/26* (2013.01); *E21B 43/2406* (2013.01)

(56) References Cited

U.S. PATENT DOCUMENTS

| | | | |
|---|---|---|---|
| 6,727,827 B1 | 4/2004 | Edwards et al. | |
| 9,000,940 B2 * | 4/2015 | Chau | E21B 47/00 340/854.4 |
| 2005/0194132 A1 * | 9/2005 | Dudley | E21B 47/00 166/254.1 |
| 2006/0137877 A1 * | 6/2006 | Watson | E21B 29/005 166/298 |
| 2011/0298462 A1 * | 12/2011 | Clark | E21B 47/024 324/346 |
| 2012/0062235 A1 | 3/2012 | Khan et al. | |
| 2013/0314092 A1 | 11/2013 | Shumway et al. | |
| 2014/0055278 A1 * | 2/2014 | Chau | E21B 17/003 340/854.4 |
| 2014/0262513 A1 * | 9/2014 | Chau | E21B 17/003 175/40 |
| 2015/0107824 A1 * | 4/2015 | Signorelli | E21B 41/0085 166/244.1 |
| 2015/0107903 A1 * | 4/2015 | Sugiura | E21B 7/06 175/45 |
| 2015/0322739 A1 * | 11/2015 | Macdonald | E21B 47/01 166/378 |
| 2016/0032660 A1 * | 2/2016 | Logan | E21B 17/003 166/378 |
| 2016/0041234 A1 | 2/2016 | Li et al. | |
| 2017/0044839 A1 * | 2/2017 | Derkacz | E21B 47/13 |
| 2018/0038218 A1 * | 2/2018 | Hay | E21B 49/00 |

* cited by examiner

ELECTRICAL ISOLATION TO REDUCE MAGNETOMETER INTERFERENCE

BACKGROUND

Oil field operators demand access to a great quantity of information regarding parameters and conditions encountered downhole. A wide variety of logging tools have been developed to collect information relating to these downhole parameters, such as the position and orientation of a bottom hole assembly, the environmental conditions in the wellbore, and the characteristics of the wellbore and any surrounding subterranean formations penetrated by the wellbore.

Formation sensors are often incorporated into logging tools to acquire and record the aforementioned downhole information. Formation sensors typically include one or more magnetometers, which are used to measure the strength and direction of magnetic fields, including the Earth's magnetic field, to determine both the position of a downhole tool as well as to identify magnetic anomalies in the surrounding subterranean formations. Detected magnetic anomalies can be indicative of petrochemical deposits or other minerals of interest.

Magnetometers are especially useful in steam assisted gravity drainage (SAGD) applications. In SAGD operations an injection well is drilled through or adjacent a hydrocarbon-bearing formation and a production well is subsequently drilled substantially parallel to the injection well, typically over a horizontal portion of each well. Steam is then injected into the surrounding formations via the injection well, which lowers the viscosity and pushes dense hydrocarbon deposits toward the production well to be produced to the Earth's surface. Magnetometers are commonly used to detect the location of the injection well and thereby help drill the production well substantially parallel to the injection well. Magnetic fields detected by the magnetometers, however, are often required to traverse vast subterranean areas. As a result, the magnetometers must be accurate and produce little to no noise.

As the sensitivity of magnetometers has increased, however, so has the design complexity of these instruments. Electronic devices, such as those used to control and monitor magnetometers, can produce electromagnetic fields that will interfere with accurate magnetometer operation. Accordingly, due to their extreme sensitivity, magnetometers typically need a low noise environment in which to operate. Electrical noise and magnetic flux interference with the magnetometers may thus introduce measurement errors.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

The present disclosure is related to downhole measurement tools and, more particularly, to electrically isolating magnetometers used in magnetic flux receiver assemblies from electrical noise.

The embodiments disclosed herein provide magnetic flux receiver assemblies that are capable of being deployed downhole in either a drilling assembly or a wireline assembly and include one or more magnetometers. To enhance downhole measurement capabilities, the magnetometers may be electronically insulated and otherwise isolated from other adjacent components of the magnetic flux receiver assembly. This may be accomplished, at least in part, by incorporating a plurality of dielectric buttons between axially opposing parts of the magnetic flux receiver assemblies, which may result in electronic and magnetic insulation. The dielectric buttons may allow high definition and high accuracy magnetometers to be packaged for severe temperatures, vibration, and electronic noise service. The electrical isolation facilitated by the buttons may eliminate electrical noise, such as static, that can often result in measurement output when high definition magnetometers are used.

Using dielectric buttons may be less expensive than incorporating an electrically-insulating sleeve or a dielectric coating to electronically insulate or isolate adjacent components of a magnetic flux receiver assembly. Electrically-insulating sleeves used in magnetic flux receiver assemblies, for example, often require complex geometries and costly machining. Moreover, if an electrically-insulating sleeve or dielectric coating becomes damaged, the entire sleeve or coating must be removed and replaced, whereas the presently described buttons may be selectively replaced when needed.

Figure 1:
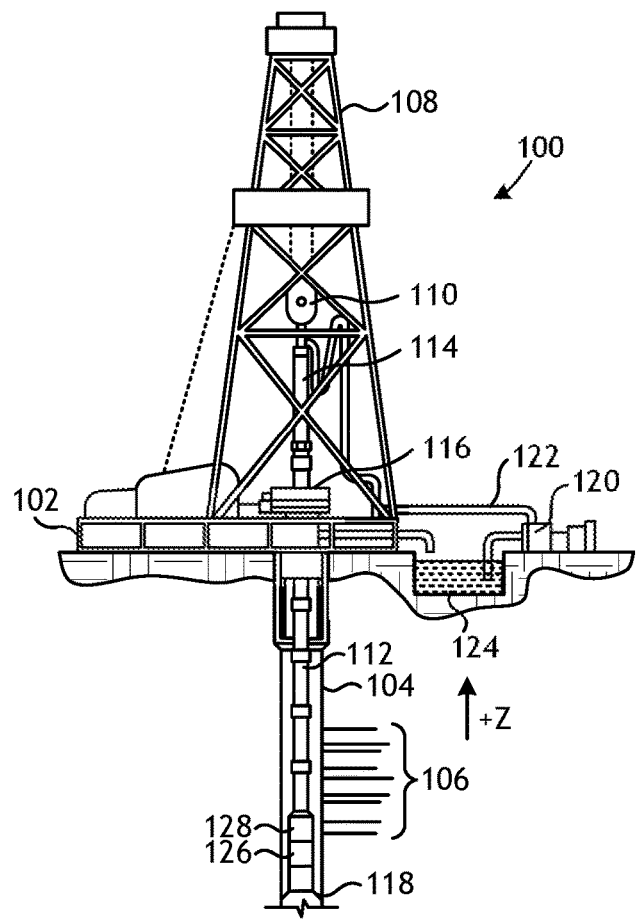
FIG. 1 is a diagram showing a drilling rig system according to various embodiments.

FIG. 1 is a schematic diagram of an exemplary drilling system 100 that may employ the principles of the present disclosure, according to one or more embodiments. As illustrated, the drilling system 100 may include a drilling platform 102 positioned at the Earth's surface and a wellbore 104 that extends from the drilling platform 102 into one or more subterranean formations 106. In other embodiments, such as in an offshore drilling operation, a volume of water may separate the drilling platform 102 and the wellbore 104.

The drilling system 100 may include a derrick 108 supported by the drilling platform 102 and having a traveling block 110 for raising and lowering a drill string 112. A kelly 114 may support the drill string 112 as it is lowered through a rotary table 116. A drill bit 118 may be coupled to the drill string 112 and driven by a downhole motor and/or by rotation of the drill string 112 by the rotary table 116. As the drill bit 118 rotates, it creates the wellbore 104, which penetrates the subterranean formations 106. A pump 120 may circulate drilling fluid through a feed pipe 122 and the kelly 114, downhole through the interior of drill string 112, through orifices in the drill bit 118, back to the surface via the annulus defined around drill string 112, and into a retention pit 124. The drilling fluid cools the drill bit 118 during operation and transports cuttings from the wellbore 104 into the retention pit 124.

The drilling system 100 may further include a bottom hole assembly (BHA) coupled to the drill string 112 near the drill bit 118. The BHA may comprise various downhole measurement tools such as, but not limited to, measurement-while-drilling (MWD) and logging-while-drilling (LWD) tools, which may be configured to take downhole measurements of drilling conditions. The MWD and LWD tools may include at least one magnetic flux receiver assembly 126, which may comprise one or more magnetometers. The magnetometers may be axially and/or angularly spaced along the length of the magnetic flux receiver assembly 126 and may comprise a plurality of antennas capable of receiving and/or transmitting one or more electromagnetic (EM) signals.

As the drill bit 118 extends the wellbore 104 through the formations 106, the magnetic flux receiver assembly 126 (i.e., the magnetometers) may collect electromagnetic measurements that may help steer the drill bit 118 along a desired trajectory. The magnetic flux receiver assembly 126 and other sensors of the MWD and LWD tools may be communicably coupled to a telemetry module 128 used to transfer measurements and signals from the BHA to a surface receiver (not shown) and/or to receive commands from the surface receiver. The telemetry module 128 may encompass any known means of downhole communication including, but not limited to, a mud pulse telemetry system, an acoustic telemetry system, a wired communications system, a wireless communications system, or any combination thereof. In certain embodiments, some or all of the measurements taken at the magnetic flux receiver assembly 126 may also be stored within the magnetic flux receiver assembly 126 or the telemetry module 128 for later retrieval at the surface upon retracting the drill string 112.

Figure 2:
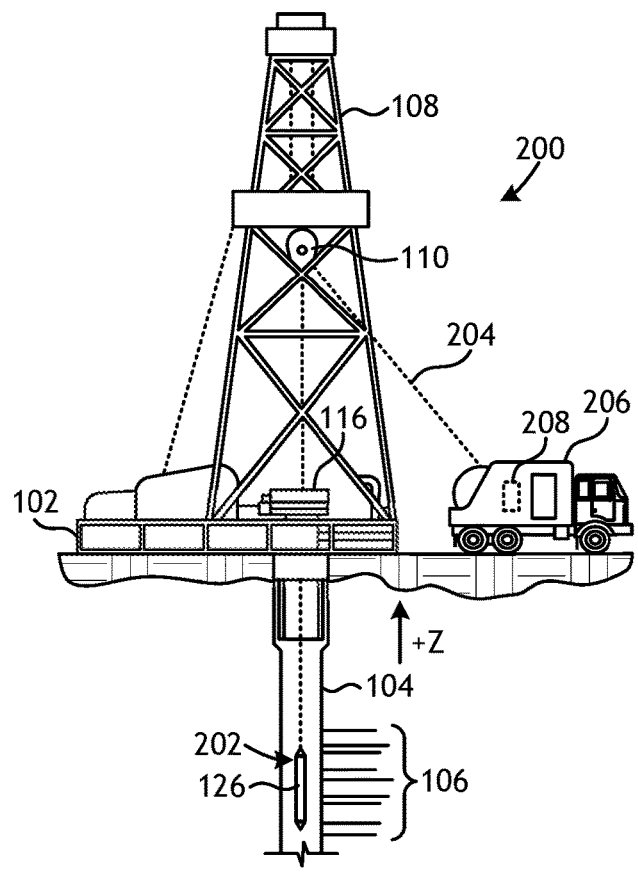
FIG. 2 is a diagram showing a wireline system according to various embodiments.

At various times during the drilling process, the drill string 112 may be removed from the wellbore 104, as shown in FIG. 2, to conduct measurement/logging operations. More particularly, FIG. 2 depicts a schematic diagram of an exemplary wireline system 200 that may also employ the principles of the present disclosure, according to one or more embodiments. Like numerals used in FIGS. 1 and 2 refer to the same components or elements and, therefore, may not be described again. As illustrated, the wireline system 200 may include a wireline instrument sonde 202 that may be suspended into the wellbore 104 on a cable 204. The wireline instrument sonde 202 may include the magnetic flux receiver assembly 126, which may be communicably coupled to the cable 204. The cable 204 may include conductors for transporting power to the wireline instrument sonde 202 and also facilitate communication between the surface and the wireline instrument sonde 202. A logging facility 206, shown in FIG. 2 as a truck, may collect measurements from the magnetic flux receiver assembly 126, and may include computing facilities 208 for controlling, processing, storing, and/or visualizing the measurements gathered by the magnetic flux receiver assembly 126. The computing facilities 208 may be communicably coupled to the magnetic flux receiver assembly 126 by way of the cable 204.

Figure 3:
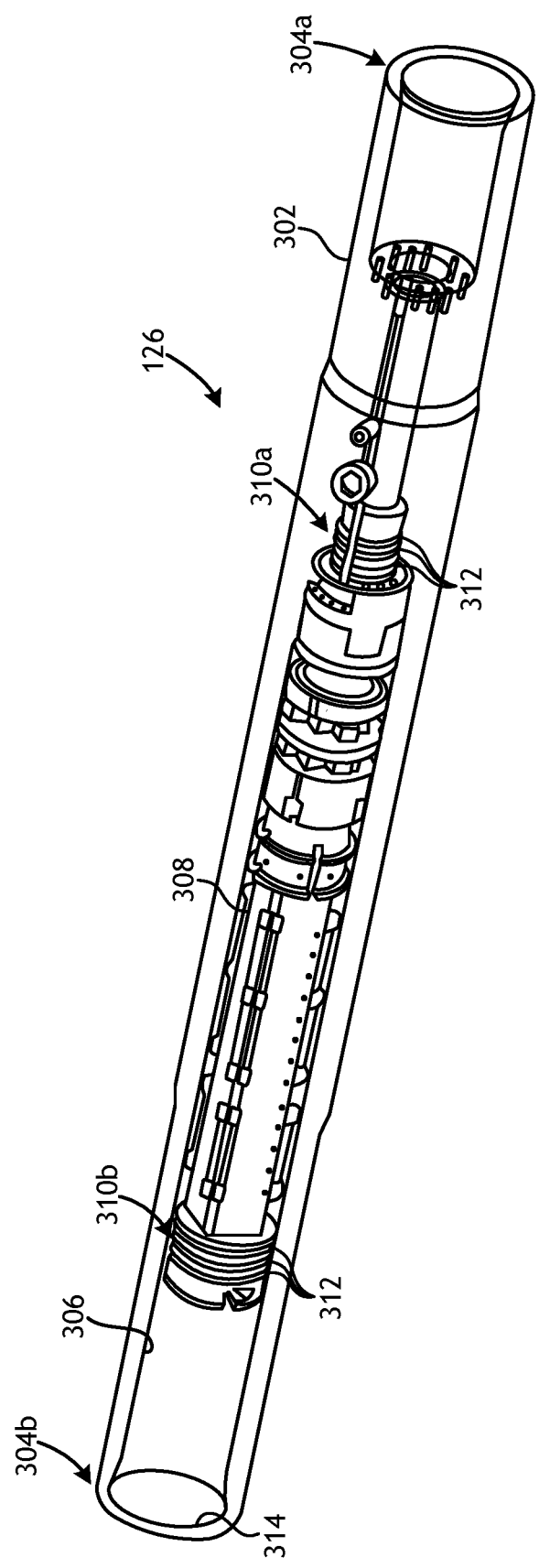
FIG. 3 is a perspective view of an exemplary magnetic flux receiver assembly.

FIG. 3 is a perspective view of an exemplary magnetic flux receiver assembly 126, according to one or more embodiments. The magnetic flux receiver assembly 126 may be the same as or similar to the magnetic flux receiver assembly 126 shown in FIGS. 1 and 2 and, therefore, may be used in drilling operations or wireline logging operations. As illustrated, the magnetic flux receiver assembly 126 may include a collar 302 having a first or downhole end 304a and a second or uphole end 304b. The collar 302 may serve as a housing for the various internal components of the magnetic flux receiver assembly 126. Accordingly, the collar 302 may alternatively be referred to as a housing for the magnetic flux receiver assembly 126.

In some embodiments, the magnetic flux receiver assembly 126 may form part of a BHA in a downhole drilling assembly, as indicated above. In such embodiments, the downhole end 304a may be arranged adjacent or coupled to the drill bit 118 (FIG. 1), and the uphole end 304b may be coupled to the drill string 112 (FIG. 1) or another portion of the BHA. In other embodiments, however, the collar 302 may be coupled to or otherwise form an integral part of the wireline instrument sonde 202 (FIG. 2), and the uphole end 304b of the collar 302 may be operatively coupled (either directly or indirectly) to the cable 204 (FIG. 2).

The collar 302 may provide and otherwise define a central passageway 306 configured to receive an elongate tool insert 308. The tool insert 308 may include one or more magnetometers (not labeled) used to receive and measure EM signals. The tool insert 308 may include a first or nose end 310a and a second or tail end 310b. In some embodiments, one or both of the nose and tail ends 310a,b may provide and otherwise define one or more radial grooves 312 configured to receive and seat a corresponding one or more O-rings (not shown) or similar types of seal devices. When the tool insert 308 is inserted into the central passageway 306 via a hole 314 defined at the uphole end 304b, the O-rings may be configured to sealingly engage the inner walls of the central passageway 306 and thereby substantially prevent fluids from migrating into the internal electrical components of the tool insert 308.

Seals positioned at the nose and tail ends 310a,b may further prove advantageous in helping the insert tool 308 remain in place within the central passageway 306. More particularly, the O-rings positioned at the nose and tail ends 310a,b may result in a differential pressure lock being generated upon introducing the magnetic flux receiver assembly 126 into a downhole environment. Since the radial surface area at the tail end 310b is larger than the radial surface area at the nose end 310a, the differential pressure generated across the insert tool 308 within the central passageway 306 will be greater at the tail end 310b as compared to the nose end 310a. This pressure difference may place a larger pressure load or force on the tail end 310b as compared to the nose end 310a, and thereby help maintain the insert tool 308 within the central passageway 306 during downhole operation.

Figure 4:
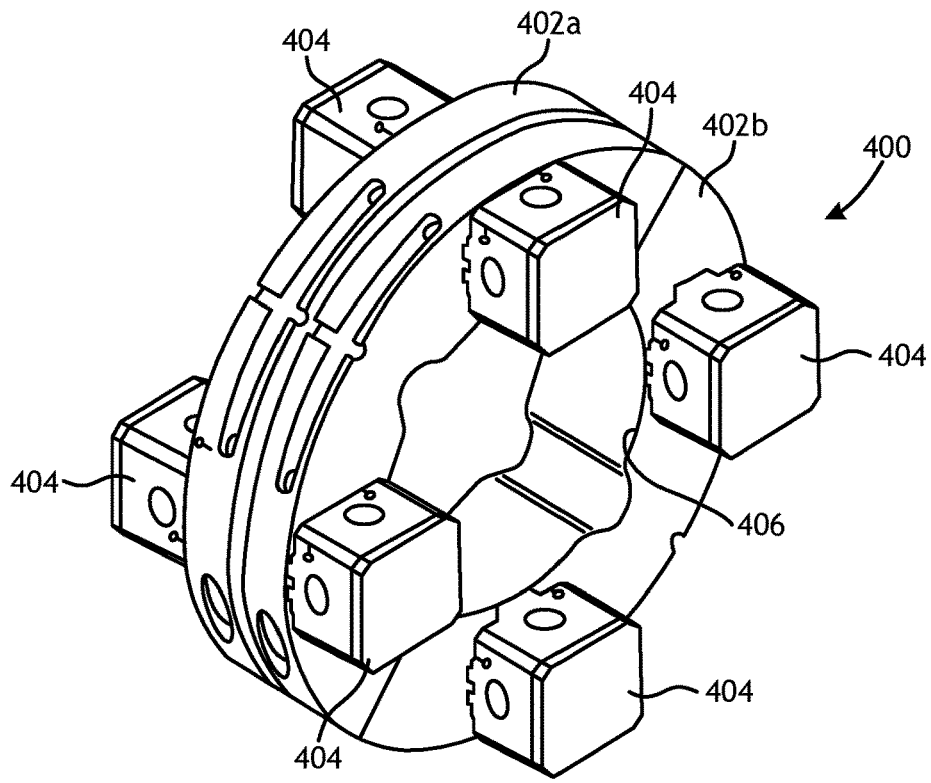
FIG. 4 is a perspective view of a mounting ring that can be included in the tool insert of FIG. 3.

FIG. 4 is a perspective view of an exemplary sensor mount 400 that may be included in the tool insert 308 of FIG. 3, according to one or more embodiments. As illustrated, the sensor mount 400 may include a first ring 402a and a second ring 402b. In some embodiments, the first and second rings 402a,b may comprise separate components. In other embodiments, however, the first and second rings 402a,b may form a monolithic structure. The first and second rings 402a,b may each be made of a dielectric material such as, but not limited to, a plastic, a composite material (e.g., fiberglass), a ceramic, or a non-conductive metal. In at least one embodiment, one or both of the first and second rings 402a,b may be or coated or otherwise overlaid with a dielectric material, without departing from the scope of the disclosure.

Figure 6:
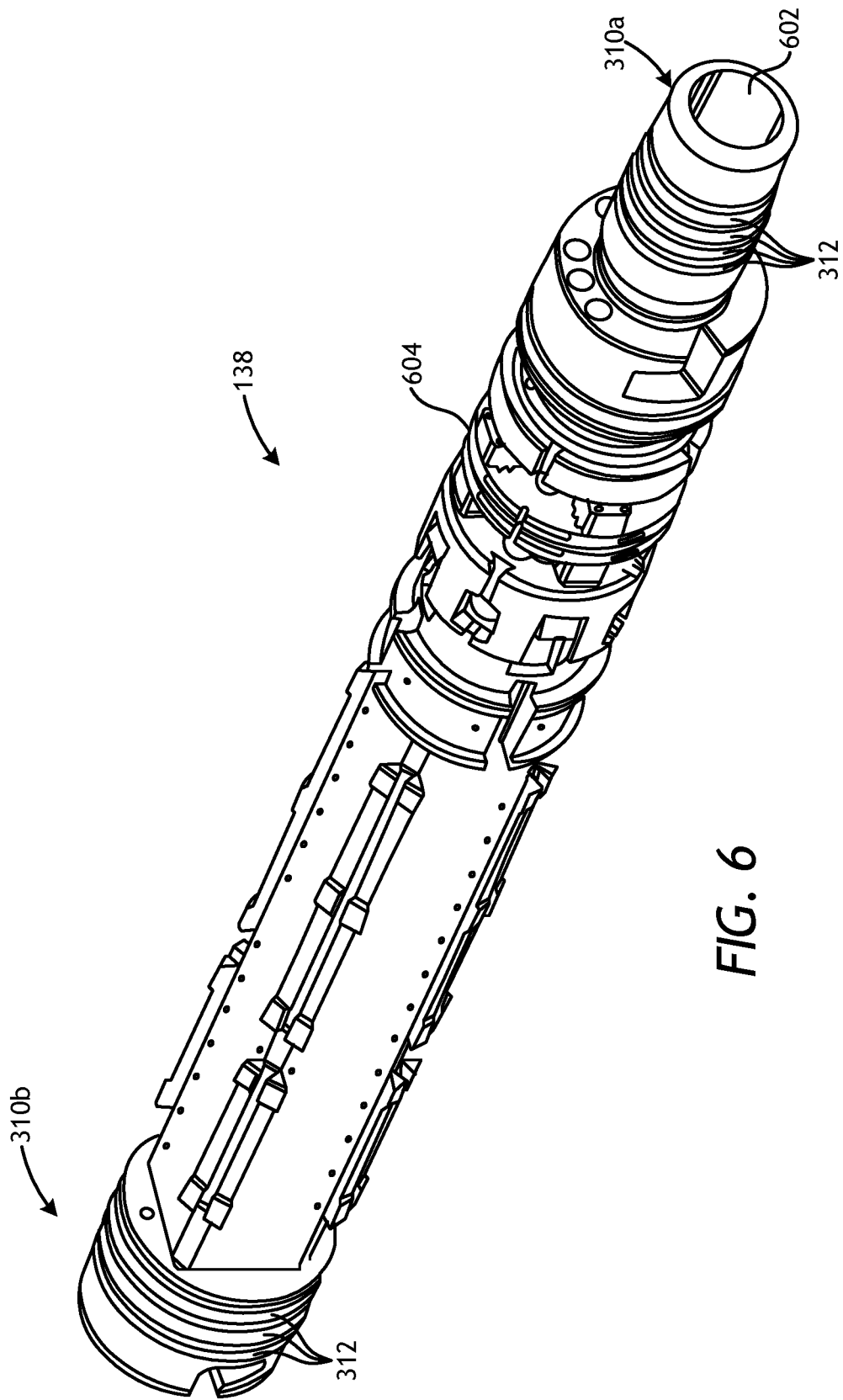
FIG. 6 is an enlarged isometric view of the tool insert of FIG. 3.

One or more magnetometers 404 may be mounted externally around the periphery of the sensor mount 400 and otherwise coupled to the first and second rings 402a,b. In the illustrated embodiment, four magnetometers 404 are depicted as being coupled to each ring 402a,b and are equidistantly spaced from each other in the angular direction. In other embodiments, however, the sensor mount 400 may include more or less than four magnetometers 400, without departing from the scope of the disclosure. The sensor mount 400 may define and otherwise provide a hole 406 configured to axially align and correspond with an axial channel 602 (FIG. 6) running longitudinally within the tool insert 308 (FIGS. 3 and 6).

Figure 5:
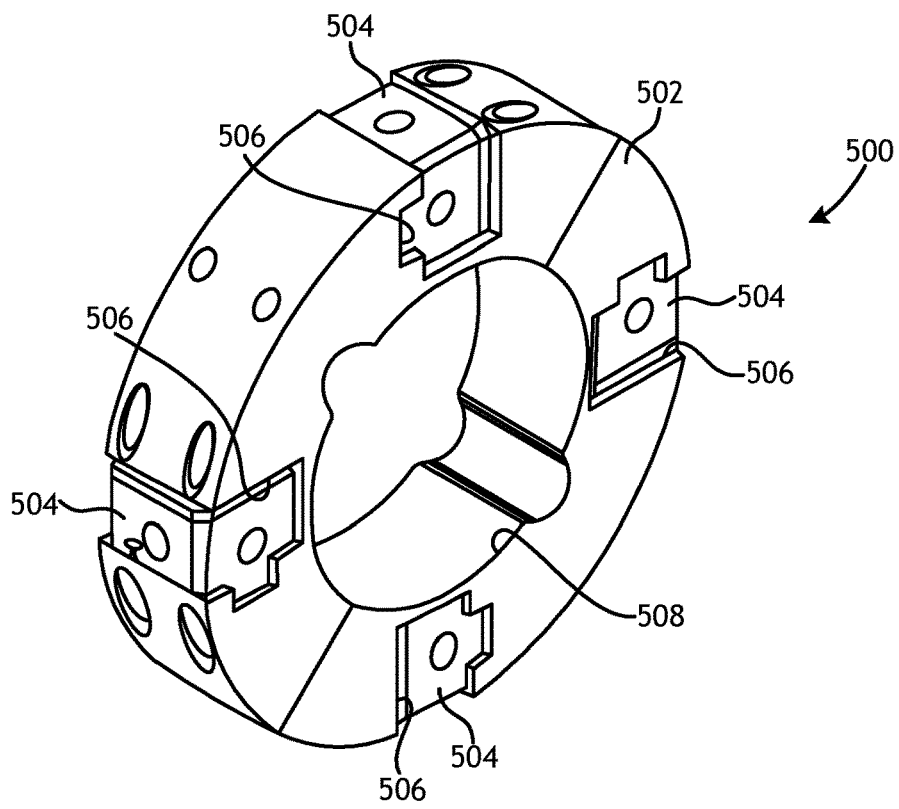
FIG. 5 is a perspective view of another mounting ring that can be included in the tool insert of FIG. 3.

FIG. 5 is a perspective view of another exemplary sensor mount 500 that may be included in the tool insert 308 of FIG. 3, according to one or more embodiments. The sensor mount 500 may comprise a monolithic ring 502 and, similar to the first and second rings 402a,b of FIG. 4, the ring 502 may be made of a dielectric material or may otherwise be coated with a dielectric material. Moreover, similar to the sensor mount 400, one or more magnetometers 504 may be mounted to the sensor mount 500. The magnetometers 404 of FIG. 4 may be the same as or similar to the magnetometers 504 of FIG. 5.

Unlike the sensor mount 400, however, the magnetometers 504 in FIG. 5 may be mounted internally to the sensor mount 500 and otherwise around the periphery of the sensor mount 500. More particularly, the ring 502 may define a plurality of channels 506 about its periphery, and each channel 506 may be configured to receive and seat a corresponding magnetometer 504. Each channel 506 may provide a radial depth sufficient to receive the corresponding magnetometer 504 and also sufficient such that the corresponding magnetometer 504 remains radially inset from the outer circumference of the ring 502. As a result, when the tool insert 308 (FIG. 3) including the sensor mount 500 is installed in the collar 302 (FIG. 3), a gap may separate the outer radial surface of each magnetometer 504 and the inner radial surface of the central passageway 306 (FIG. 3). As will be appreciated, this may reduce the chance of the magnetometers 504 contacting the metal of the collar 302.

The sensor mount 500 may further define and otherwise provide a hole 508. Similar to the hole 406 of the magnetometer 400 of FIG. 4, the hole 508 may be configured to axially align with and otherwise correspond with the axial channel 602 (FIG. 6) running longitudinally within the tool insert 308 (FIGS. 3 and 6).

FIG. 6 is an enlarged isometric view of the tool insert 308 of FIG. 3. Reference numerals used in FIG. 3 that are used in FIG. 6 refer to similar components or elements that may not be described again. As illustrated, the tool insert 308 may define and otherwise provide an axial channel 602 that extends longitudinally between the nose and tail ends 310a, b. Moreover, the tool insert 308 may further include a sensor mount 604 installed along the axial length of the tool string 138. In the illustrated embodiment, the sensor mount 604 is substantially similar to or the same as the sensor mount 400 of FIG. 4. In other embodiments, however, the sensor mount 604 may otherwise be replaced with the sensor mount 500 of FIG. 5, without departing from the scope of the disclosure. In yet other embodiments, the sensor mount 604 may alternatively provide the magnetometers in a cavity defined through a portion of the both the tool insert 308 and the collar 302 (FIG. 3), or via a gap sub that interposes upper and lower portions of the collar 302, without departing from the scope of the disclosure.

Figure 7:
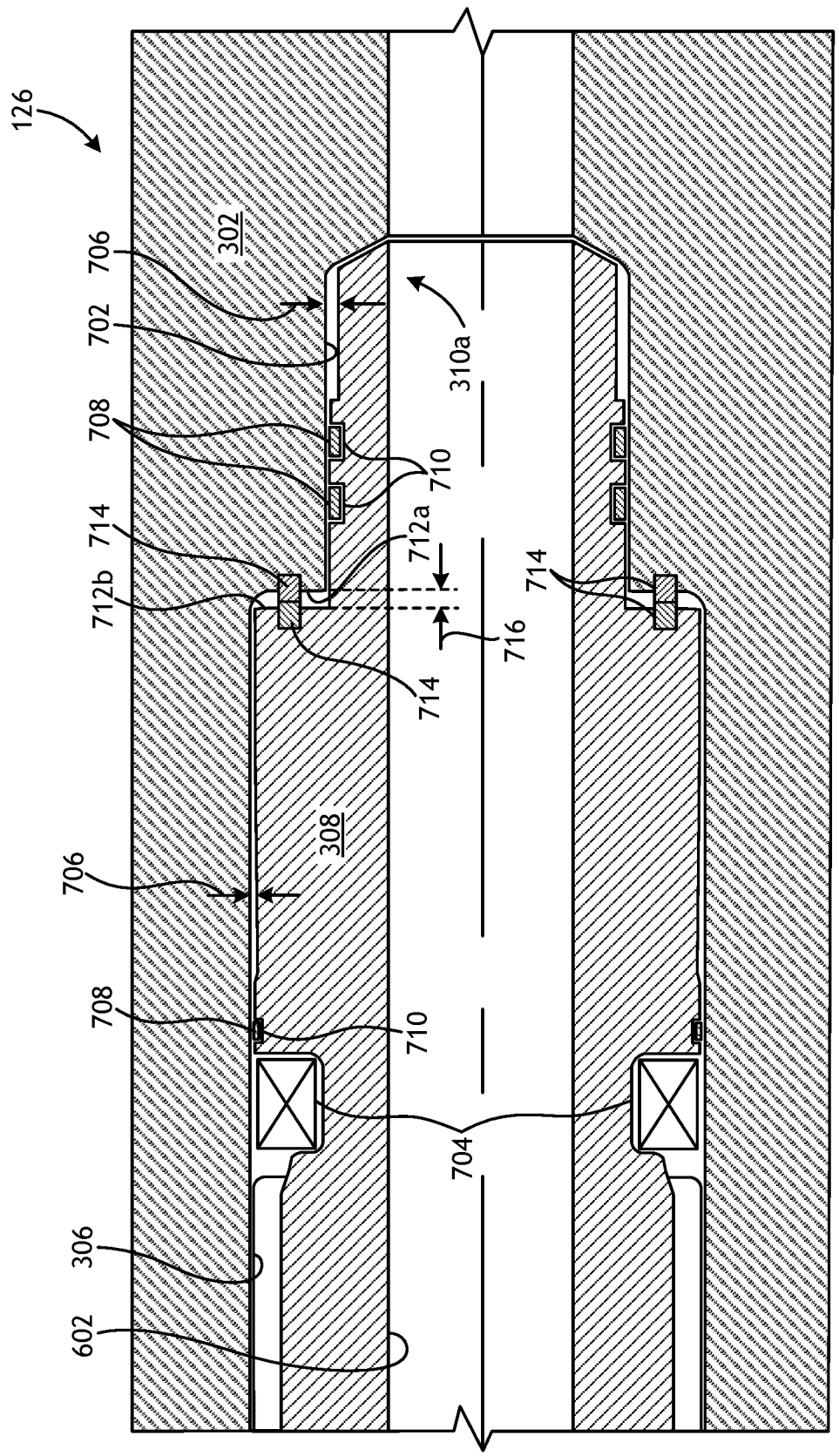
FIG. 7 is an enlarged cross-sectional side view of a portion of the magnetic flux receiver assembly of FIG. 3.

FIG. 7 is an enlarged cross-sectional side view of a portion of the magnetic flux receiver assembly 126 of FIG. 3, according to one or more embodiments. As illustrated, the tool insert 308 is received into the collar 302 and otherwise into the central passageway 306 defined within the collar 302. The nose end 310a of the tool insert 308 may be received into a reduced-diameter section 702 of the central passageway 306, and the axial channel 602 may be configured to axially align with the central passageway 306 such that fluids passing through the axial channel 602 will be conveyed to the central passageway 306 and past the reduced-diameter section 702.

Two magnetometers 704 are shown mounted to the tool insert 308. The magnetometers 704 may be similar to or the same as any of the magnetometers 404 or 504 of FIGS. 4 and 5, respectively. It will be appreciated, however, that more than two magnetometers 704 may be used, and the magnetometers 704 may be mounted to the tool insert 308 in a variety of alternative configurations, without departing from the scope of the disclosure.

Since the tool insert 308 and the collar 302 are typically made of a conductive metal (e.g., steel), it is desirable to electrically insulate the tool insert 308 from the collar 302 and thereby reduce or substantially eliminate any noise that may interfere with magnetic field measurements obtained by the magnetometers 704. To accomplish this, the tool insert 308 may be sized such that when it is received within the collar 302, a radial gap 706 is defined between the outer radial surfaces of the tool insert 308 and the inner radial surfaces of the collar 302. To ensure that the radial gap 706 remains, one or more bands 708 may be arranged within a corresponding one or more annular grooves 710 defined in the outer radial surface of the tool insert 308. The bands 708 may comprise a dielectric or non-conductive material such as, but not limited to, a polymer (e.g., polyether ether ketone or PEEK), an elastomer, a rubber, a glass, a ceramic, a composite material (e.g., fiberglass), or any combination thereof. The bands 708 may prove useful not only in electrically isolating the tool insert 308 from the collar 302, but also in centralizing the tool insert 308 within the central passageway 306 such that the radial gap 706 is maintained during downhole operation.

As illustrated, the collar 302 may define and otherwise provide an axial collar face 712a and the tool insert 308 may define and otherwise provide an opposing axial insert face 712b. When the tool insert 308 is received within the collar 302 and advanced within the central passageway 306, the axial collar and insert faces 712a,b may be positioned axially adjacent one another. To electrically insulate the tool insert 308 from the collar 302 in the axial direction at the axial collar and insert faces 712a,b, the magnetic flux receiver assembly 126 may further include one or more buttons 714 that interpose the axial collar and insert faces 712a,b such that an axial gap 716 is formed therebetween. The axial gap 716 may prevent or substantially mitigate electrical communication between the tool insert 308 and the collar 302 in the axial direction.

The buttons 714 may each be made of and otherwise comprise a dielectric, non-conductive, and high strength material such as, but not limited to, a polymer (e.g., polyether ether ketone or PEEK), a glass, a ceramic, a composite material (e.g., fiberglass), or any combination thereof. Each button 714 may comprise a generally cylindrical structure that may exhibit a variety of cross-sectional shapes. In some embodiments, for example, one or more of the buttons 714 may exhibit a circular cross-sectional shape. In other embodiments, however, one or more of the buttons 714 may exhibit an ovular or elliptical cross-sectional shape. In yet other embodiments, one or more of the buttons 714 may exhibit a polygonal cross-sectional shape, such as triangular, square, rectangular, etc., without departing from the scope of the disclosure.

In the illustrated embodiment, the axial collar face 712a may include at least two buttons 714 and the axial insert face 712b may also include at least two buttons 714, where the buttons 714 of each axial collar and insert face 712a,b are axially aligned and otherwise co-axial. Consequently, during downhole operation, the axially aligned buttons 714 may be configured to engage one another to provide the axial gap 716 that electrically insulates the tool insert 308 from the collar 302 in the axial direction. In other embodiments, however, the buttons 714 may alternatively by staggered and otherwise angularly offset from each other, as discussed in more detail below. In yet other embodiments, only one of the axial collar and insert faces 712a,b may include buttons 714 to provide the axial gap 716 that electrically insulates the tool insert 308 from the collar 302 in the axial direction.

Figure 8A:
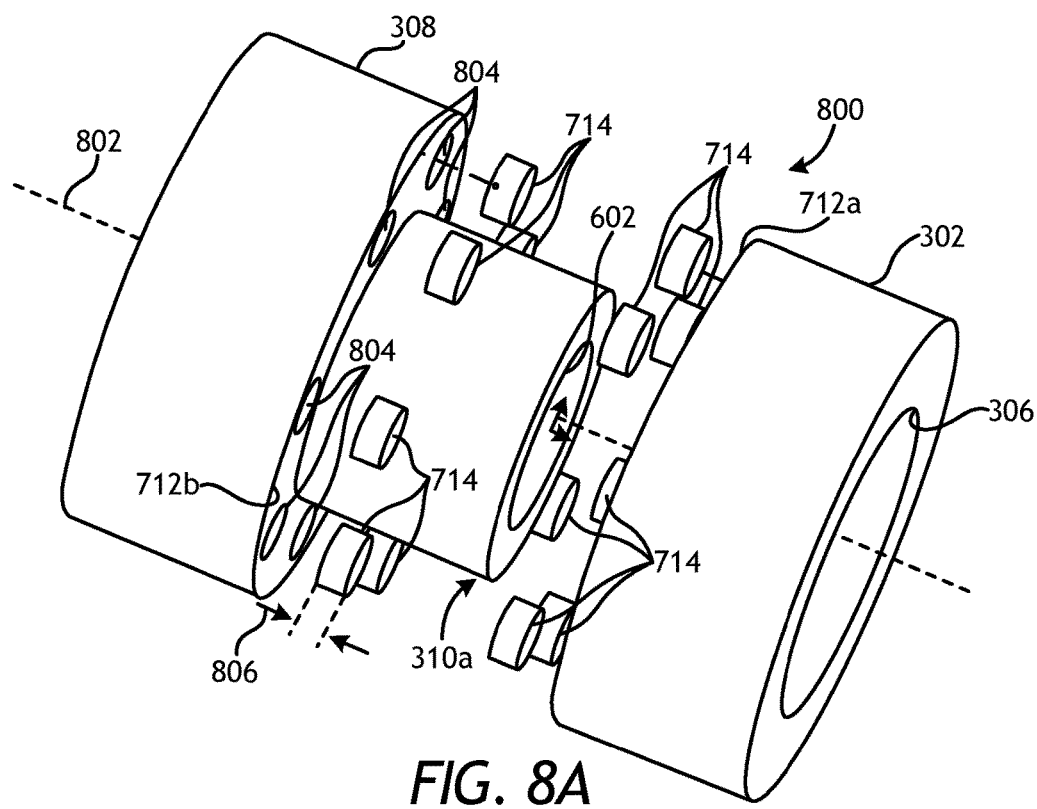
FIGS. 8A and 8B are exploded isometric views of an axial interface between the collar and the tool insert of FIG. 7.
Figure 8B:
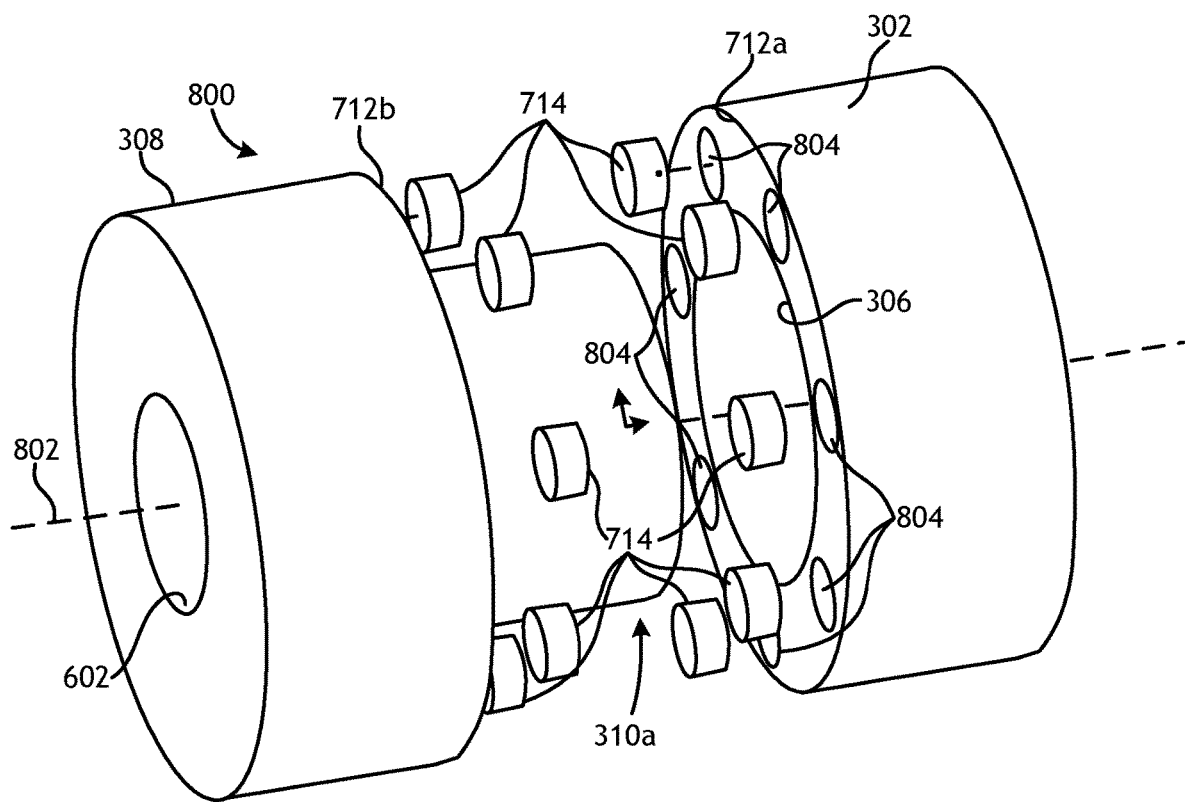

Referring now to FIGS. 8A and 8B, with continued reference to FIG. 7, illustrated are exploded isometric views of an axial interface 800 between the collar 302 and the tool insert 308. More particularly, FIGS. 8A and 8B are enlarged views showing the interface between the axial collar and insert faces 712a,b. In the illustrated embodiment, the outer circumference of the collar 302 and the tool insert 308 are the substantially the dimension. It will be appreciated, however, that portions of the collar 302 may be radially larger than the tool insert 308 and may extend axially about the outer circumference of the tool insert 308, as generally shown in FIG. 7. Nevertheless, the specific configuration of the axial interface 800 shown in FIGS. 8A and 8B is provided for illustrative purposes in detailing the axial interaction between the axial collar and insert faces 712a,b, which would otherwise be occluded by the collar 302. Reference numerals used in prior figures that are used in FIGS. 8A and 8B refer to the same elements or components and, therefore, may not be described again.

The collar 302 and the tool insert 308 may be axially aligned along a longitudinal axis 802, and the axial collar and insert faces 712a,b may each be oriented perpendicularly to the longitudinal axis 802. The buttons 714 may be coupled to one or both of the axial collar and insert faces 712a,b. In some embodiments, as illustrated, each of the axial collar and insert faces 712a,b may define one or more cavities 804, where each cavity 804 is configured to receive and seat a corresponding button 714. Accordingly, the number of buttons 714 and the number of cavities 804 defined in each of the axial collar and insert faces 712a,b may be the same.

The buttons 714 can be received and otherwise seated within corresponding cavities 804 via a variety of means. In some embodiments, for instance, the buttons 714 may be received within the cavities 814 via an interference fit or a press fit. In other embodiments, however, the buttons 714 may be welded, brazed, or glued (i.e., using an adhesive) into the corresponding cavities 814. In yet other embodiments, the buttons 714 may be threaded into the cavities 814 or otherwise secured within the cavities 814 using one or more mechanical fasteners, such as screws, bolts, pins, snap rings, or any combination thereof.

In some embodiments, the cavities 804 may be omitted from one or both of the axial collar and insert faces 712a,b. In such embodiments, the buttons 714 may alternatively be coupled directly to the axial collar and/or insert faces 712a,b and may, therefore, extend axially from the axial collar and/or insert faces 712a,b. This may be accomplished, for example, by welding, brazing, or gluing the buttons 714 to one or both of the axial collar and insert faces 712a,b.

Each button 714 may exhibit a depth or length 806 (FIG. 8A). Depending on the application, and whether the button 714 will contact an opposing button 714, the length 806 of a given button 714 may be varied to ensure that the axial collar face 712a is prevented from engaging or contacting the axial insert face 712b when the tool insert 308 is received within the collar 302.

Figure 9:
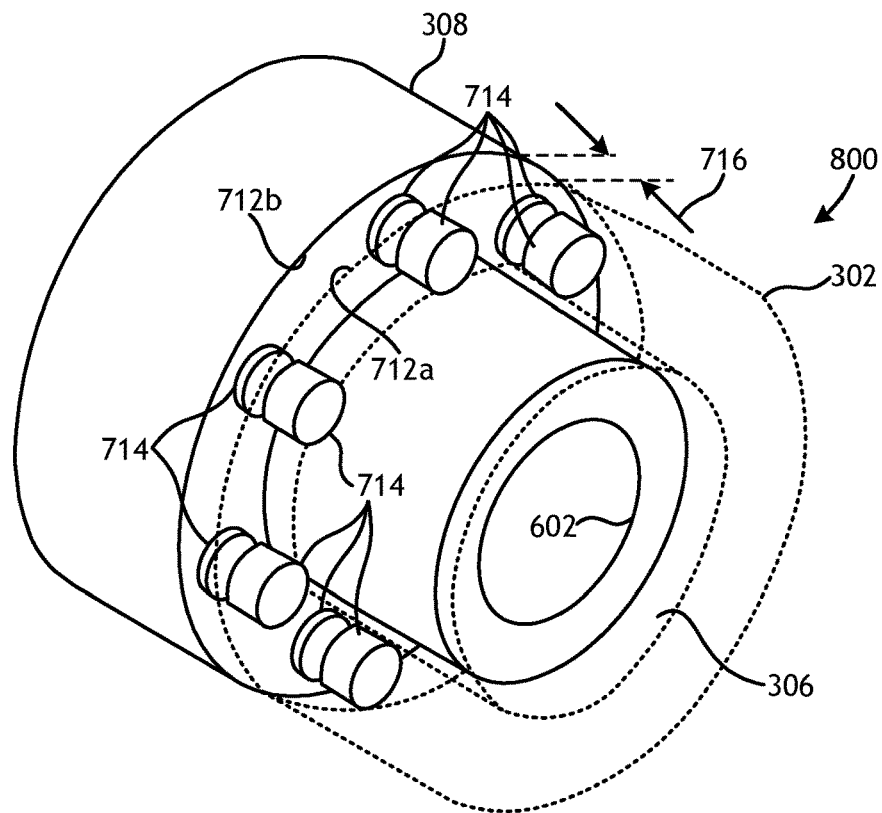
FIG. 9 is a perspective view of the axial interface of FIGS. 8A and 8B in an assembled configuration.

FIG. 9 is a perspective view of the axial interface 800 of FIGS. 8A and 8B in an assembled configuration. The collar 302 is shown in phantom in FIG. 9 so that the internal components of the collar 302 are at least partially visible. Reference numerals used in prior figures that are used in FIG. 9 again refer to the same elements or components and, therefore, may not be described again.

As illustrated, when the tool insert 308 is received within the collar 302 and the axial insert face 712b is advanced toward the axial collar face 712a, the buttons 714 may prevent the axial collar face 712a from engaging or contacting the axial insert face 712b. More particularly, the buttons 714 coupled to one or both of the axial collar and insert faces 712a,b may result in the formation of the axial gap 716 between the axial collar and insert faces 712a,b when the axial interface 800 is assembled. Accordingly, the buttons 714 help to electrically insulate the tool insert 308 from the collar 302.

In the illustrated embodiment, the buttons 714 are axially aligned and, therefore, each button 714 will engage an opposing button 714 on the opposing axial collar or insert face 712a,b when the tool insert 308 is received within the collar 302. Axially aligned or co-axial buttons 714 may prove advantageous in allowing the compressive strength of the buttons 714 to be exploited during operation, while the shear strength of the buttons 714 is compensated for by securing the buttons 714 within the corresponding cavities 804 (FIGS. 8A-8B).

As indicated above, however, in at least one embodiment, some of the buttons 714 (and corresponding cavities 804 of FIGS. 8A and 8B) may be omitted from the axial collar and/or insert faces 712a,b. In such embodiments, some of the buttons 714 may instead directly engage the opposing axial collar or insert face 712a,b. For instance, in some embodiments, the buttons 714 may be provided only on the axial collar face 712a or alternatively only on the axial insert face 712b, without departing from the scope of the disclosure.

It should be noted that the buttons 714 are depicted in FIG. 9 as being angularly spaced from each other equidistantly on each of the axial collar and insert faces 712a,b. In other embodiments, however, the buttons 714 may alternatively be randomly spaced and nonetheless co-axial, without departing from the scope of the disclosure.

Figure 10:
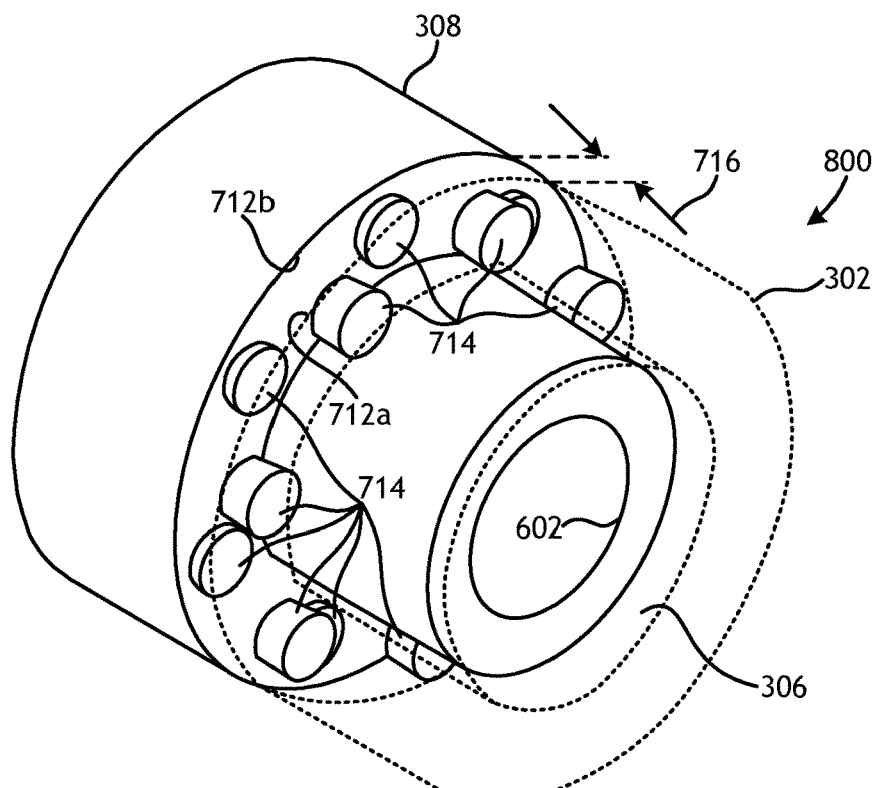
FIG. 10 is a perspective view of another embodiment of the axial interface of FIGS. 8A and 8B in an assembled configuration.

FIG. 10 is a perspective view of another exemplary embodiment of the axial interface 800 of FIGS. 8A and 8B in an assembled configuration, according to one or more additional embodiments. The collar 302 is again shown in phantom in FIG. 10 so that the internal components of the collar 302 are at least partially visible for description purposes. Moreover, reference numerals used in prior figures that are used in FIG. 10 again refer to the same elements or components and, therefore, may not be described again.

In the illustrated embodiment, the buttons 714 coupled to the axial collar and insert faces 712a,b are not axially aligned, as in the embodiment of FIGS. 8A-8B and 9, but are rather, staggered and otherwise angularly offset from each other. As a result, when the tool insert 308 is received within the collar 302 and the axial insert face 712b is advanced toward the axial collar face 712a, the buttons 714 coupled to the axial collar face 712a will engage the opposing axial insert face 712b and the buttons 714 coupled to the axial insert face 712b will engage the opposing axial collar face 712a.

Similar to the embodiment of FIG. 9, however, the buttons 714 may again prevent the axial collar face 712a from engaging or contacting the axial insert face 712b, and thereby help electrically insulate the tool insert 308 from the collar 302 in the axial direction. Staggering the buttons 714, as shown in FIG. 10, allows the buttons 714 to directly engage opposing axial collar or insert faces 712a,b, thereby allowing the compressive strength of the buttons 714 to be exploited while the shear strength of the buttons is still compensated for by securing the buttons 714 within corresponding cavities 804 (FIGS. 8A-8B). Moreover, the axial load assumed at the axial interface 800 may be distributed between all the buttons 714. In other embodiments, however, some of the cavities 804 may be omitted and corresponding buttons 714 may instead be directly coupled to either of the axial collar and insert faces 712a,b, as mentioned above.

Embodiments disclosed herein include:

A. A magnetic flux receiver assembly that includes a collar that defines a central passageway and an axial collar face, a tool insert disposable within the central passageway and defining an axial insert face, one or more magnetometers operatively coupled to the tool insert, and one or more buttons coupled to one or both of the axial collar face and the axial insert face such that an axial gap is defined at an axial interface between the axial collar face and the axial insert face to prevent electrical communication across the axial interface.

B. A method that includes introducing a magnetic flux receiver assembly into a wellbore, the magnetic flux receiver assembly including a collar that defines a central passageway and an axial collar face, and a tool insert disposable within the central passageway and defining an axial insert face, electrically isolating the tool insert from the collar with one or more buttons coupled to one or both of the axial collar face and the axial insert face such that an axial gap is defined at an axial interface between the axial collar face and the axial insert face, and obtaining measurements from one or more magnetometers operatively coupled to the tool insert.

Each of embodiments A and B may have one or more of the following additional elements in any combination: Element 1: wherein the one or more buttons comprise a dielectric material selected from the group consisting of a polymer, a glass, a ceramic, a composite material, or any combination thereof. Element 2: wherein the one or more buttons exhibit a cross-sectional shape selected from the group consisting of circular, elliptical, polygonal, or any combination thereof. Element 3: wherein the one or more buttons comprise one or more buttons coupled to the axial collar face and one or more buttons coupled to the axial insert face. Element 4: wherein the one or more buttons coupled to the axial collar face are co-axial with the one or more buttons coupled to the axial insert face. Element 5: wherein the one or more buttons coupled to the axial collar face are angularly offset from the one or more buttons coupled to the axial insert face. Element 6: wherein the one or more buttons are coupled to only one of the axial collar face and the axial insert face. Element 7: further comprising one or more cavities defined in one or both of the axial collar face and the axial insert face, wherein the one or more buttons are received within the one or more cavities. Element 8: wherein the one or more buttons are secured within the one or more cavities via at least one of an interference fit, a press fit, a weld, braze, an adhesive, a threaded engagement, a mechanical fastener, or any combination thereof. Element 9: wherein the one or more buttons are coupled directly to one or both of the axial collar face and the axial insert face and extend axially therefrom. Element 10: further comprising one or more bands positioned within a corresponding one or more annular grooves defined in an outer radial surface of the tool insert. Element 11: wherein the one or more buttons are angularly spaced from each other equidistantly about one or both of the axial collar face and the axial insert face.

Element 12: wherein introducing the magnetic flux receiver assembly into the wellbore comprises coupling the collar to a drill string having a drill bit positioned at a distal end of the drill string, and conveying the drill string into the wellbore and drilling a portion of the wellbore with the drill string. Element 13: wherein introducing the magnetic flux receiver assembly into the wellbore comprises coupling the collar to a wireline, and conveying the magnetic flux receiver assembly into the wellbore on the wireline. Element 14: wherein the one or more buttons comprise a dielectric material selected from the group consisting of a polymer, a glass, a ceramic, a composite material, or any combination thereof. Element 15: wherein electrically isolating the tool insert from the collar with the one or more buttons comprises receiving the one or more buttons in one or more cavities defined in one or both of the axial collar face and the axial insert face. Element 16: further comprising centralizing the tool insert within the central passageway with one or more bands positioned within a corresponding one or more annular grooves defined in an outer radial surface of the tool insert, and generating a radial gap between the tool insert and the collar with the one or more bands and thereby electrically-isolating the tool insert from the collar in the radial direction. Element 17: wherein the one or more buttons comprise one or more buttons coupled to the axial collar face and co-axial with one or more buttons coupled to the axial insert face, the method further comprising engaging the one or more buttons coupled to the axial collar face against the one or more buttons coupled to the axial insert face to electrically-isolate the tool insert from the collar. Element 18: wherein the one or more buttons comprise one or more buttons coupled to the axial collar face and angularly offset from one or more buttons coupled to the axial insert face, the method further comprising engaging the one or more buttons coupled to the axial collar face against the axial insert face to electrically-isolate the tool insert from the collar, and engaging the one or more buttons coupled to the axial insert face against the axial collar face to electrically-isolate the tool insert from the collar.

By way of non-limiting example, exemplary combinations applicable to A and B include: Element 4 with Element 5; and Element 7 with Element 8.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

What is claimed is:

1. A magnetic flux receiver assembly, comprising:
   a collar that defines a central passageway extending from a first end of the collar to a second end of the collar, the collar further defining an axial collar face;
   a tool insert disposable entirely within the central passageway and defining an axial insert face and a channel for providing fluid communication between the first end of the collar to the second end of the collar;
   one or more magnetometers mounted to the tool insert and disposable entirely within the central passageway; and
   one or more cavities positioned in the axial collar face and the axial insert face;
   a plurality of insulating members interposing the axial collar and insert faces, including a first set of one or more insulating members only seated within the one or more cavities of the axial collar face and a second set of one or more insulating members only seated within the one or more cavities of the axial insert face, wherein the first set of one or more insulating members and the second set of one or more insulating members are in direct contact with each other such that an axial gap is defined at an axial interface between the axial collar face and the axial insert face to prevent electrical communication across the axial interface.

2. The magnetic flux receiver assembly of claim 1, wherein the one or more insulating members comprise a dielectric material selected from the group consisting of a polymer, a glass, a ceramic, a composite material, or any combination thereof.

3. The magnetic flux receiver assembly of claim 1, wherein the one or more insulating members exhibit a cross-sectional shape selected from the group consisting of circular, elliptical, polygonal, or any combination thereof.

4. The magnetic flux receiver assembly of claim 1, wherein the first set of one or more insulating members are co-axial with the second set of one or more insulating members.

5. The magnetic flux receiver assembly of claim 1, wherein the first set of one or more insulating members are angularly offset from the second set of one or more insulating members.

6. The magnetic flux receiver assembly of claim 1, wherein the one or more insulating members are seated within the one or more cavities via at least one of an interference fit, a press fit, a weld, braze, an adhesive, a threaded engagement, a mechanical fastener, or any combination thereof.

7. The magnetic flux receiver assembly of claim 1, further comprising one or more bands positioned within a corresponding one or more annular grooves defined in the outer radial surface of the tool insert.

8. The magnetic flux receiver assembly of claim 1, wherein the one or more insulating members are angularly spaced from each other equidistantly about one or both of the axial collar face and the axial insert face.

9. The magnetic flux receiver assembly of claim 1, further comprising a first ring and a second ring, wherein the one or more magnetometers are mounted on the first and second rings.

10. The magnetic flux receiver assembly of claim 1, further comprising a monolithic ring, wherein the one or more magnetometers are mounted on the monolithic ring.

11. A method, comprising:
    introducing a magnetic flux receiver assembly into a wellbore, the magnetic flux receiver assembly including a collar that defines a central passageway, extending from a first end of the collar to a second end of the collar, and an axial collar face, the magnetic flux receiver assembly further including a tool insert disposed entirely within the central passageway and defining an axial insert face and a channel providing fluid communication between the first end of the collar to the second end of the collar;
    electrically isolating the tool insert from the collar with one or more insulating members interposing the axial collar and insert faces, including a first set of one or more insulating members only coupled to the axial collar face and a second set of one or more insulating members only coupled to the axial insert face, wherein the first set of one or more insulating members and the second set of one or more insulating members are in direct contact with each other such that an axial gap is defined at an axial interface between the axial collar face and the axial insert face; and
    obtaining measurements from one or more magnetometers mounted to the tool insert and disposed entirely within the central passageway;
    centralizing the tool insert within the central passageway with one or more bands positioned within a corresponding one or more annular grooves defined in an outer radial surface of the tool insert; and
    generating a radial gap between the tool insert and the collar with the one or more bands and thereby electrically-isolating the tool insert from the collar in a radial direction, wherein the radial gap extends longitudinally from the one or more magnetometers to the axial insert face, the radial gap defined between the outer radial surface of the tool insert and an inner radial surface of the collar.

12. The method of claim 11, wherein introducing the magnetic flux receiver assembly into the wellbore comprises:
coupling the collar to a drill string having a drill bit positioned at a distal end of the drill string; and
conveying the drill string into the wellbore and drilling a portion of the wellbore with the drill string.

13. The method of claim 11, wherein introducing the magnetic flux receiver assembly into the wellbore comprises:
coupling the collar to a wireline; and
conveying the magnetic flux receiver assembly into the wellbore on the wireline.

14. The method of claim 11, wherein the one or more insulating members comprise a dielectric material selected from the group consisting of a polymer, a glass, a ceramic, a composite material, or any combination thereof.

15. The method of claim 11, wherein electrically isolating the tool insert from the collar with the one or more insulating members comprises receiving the one or more insulating members in one or more cavities defined in one or both of the axial collar face and the axial insert face.

16. The method of claim 11, further comprising:
engaging the first set of one or more insulating members against the axial insert face to electrically-isolate the tool insert from the collar; and
engaging the second set of one or more insulating members against the axial collar face to electrically-isolate the tool insert from the collar.

17. The method of claim 11, wherein the magnetic flux receiver assembly further comprises a first ring and a second ring, wherein the one or more magnetometers are mounted on the first and second rings.

18. The method of claim 11, wherein the magnetic flux receiver assembly further comprises a monolithic ring, wherein the one or more magnetometers are mounted on the monolithic ring.

19. A magnetic flux receiver assembly, comprising:
a collar that defines a central passageway extending from a first end of the collar to a second end of the collar, the collar further defining an axial collar face;
a tool insert disposable entirely within the central passageway and defining an axial insert face and a channel for providing fluid communication between the first end of the collar to the second end of the collar;
one or more magnetometers mounted to the tool insert and disposable entirely within the central passageway; and
one or more cavities positioned in the axial collar face and the axial insert face;
a plurality of insulating members interposing the axial collar and insert faces including a first set of one or more insulating members only seated within the one or more cavities of the axial collar face and a second set of one or more insulating members only seated within the one or more cavities of the axial insert face, such that an axial gap is defined at an axial interface between the axial collar face and the axial insert face to prevent electrical communication across the axial interface, wherein the first set of one or more insulating members and the second set of one or more insulating members are angularly offset.

\* \* \* \* \*